United States Patent
Jeng et al.

[11] Patent Number: 5,905,293
[45] Date of Patent: May 18, 1999

[54] LDD SPACERS IN MOS DEVICES WITH DOUBLE SPACERS

[75] Inventors: Erik S. Jeng, Taipei; Ing-Ruey Liaw, Hsinchu, both of Taiwan

[73] Assignee: Vanguard International Semiconductor Corporation, Hsin-Chu, Taiwan

[21] Appl. No.: 09/055,434

[22] Filed: Apr. 6, 1998

Related U.S. Application Data

[62] Division of application No. 08/851,401, May 5, 1997, Pat. No. 5,763,312.

[51] Int. Cl.$^6$ .......................... H01L 29/76; H01L 27/088
[52] U.S. Cl. .......................... 257/408; 257/401; 257/900; 257/336
[58] Field of Search ..................... 257/408, 344, 257/900, 401, 336, 391, 394, 550, 647; 438/305, 304, 303

[56] References Cited

U.S. PATENT DOCUMENTS

| | | | |
|---|---|---|---|
| 5,208,472 | 5/1993 | Su et al. .................. | 257/344 |
| 5,240,872 | 8/1993 | Motonami et al. .......... | 438/253 |
| 5,468,665 | 11/1995 | Lee et al. ................ | 438/231 |
| 5,494,838 | 2/1996 | Chang et al. ............. | 438/264 |
| 5,498,555 | 3/1996 | Lin ....................... | 438/302 |
| 5,702,972 | 12/1997 | Tsai et al. ............... | 438/305 |

*Primary Examiner*—Minh Loan Tran
*Assistant Examiner*—Hung Kim Vu
*Attorney, Agent, or Firm*—George O. Saile; Stephen B. Ackerman; Graham S. Jones, II

[57] ABSTRACT

In MOSFET devices with a pair of gate conductor stacks formed of a gate oxide layer, a gate electrode layer and a dielectric cap layer, LDD regions are formed by ion implanting lightly doped regions in the surface of the substrate. The LDD regions are self-aligned with the gate conductor stacks. Then form first dielectric spacers of a first dielectric material on the sidewalls of the gate conductor stacks; and form second dielectric spacers of a second dielectric material on the sidewalls of the first dielectric spacers adjacent to the gate conductor stacks thereby forming double sidewall spacers. Form fully doped regions ion implanted into the surface of the substrate self-aligned with the double sidewall spacers. The fully doped regions are self-aligned with the first and second dielectric spacers formed on the gate conductor stacks. The device is covered with a blanket dielectric layer formed by LPCVD from a TEOS source. Above the new dielectric layer, a mask is formed with a contact opening therethrough over a contact region. Then etch away the second dielectric spacers below the contact opening to form self-aligned contact regions reaching down to the substrate between the first dielectric spacers.

17 Claims, 5 Drawing Sheets

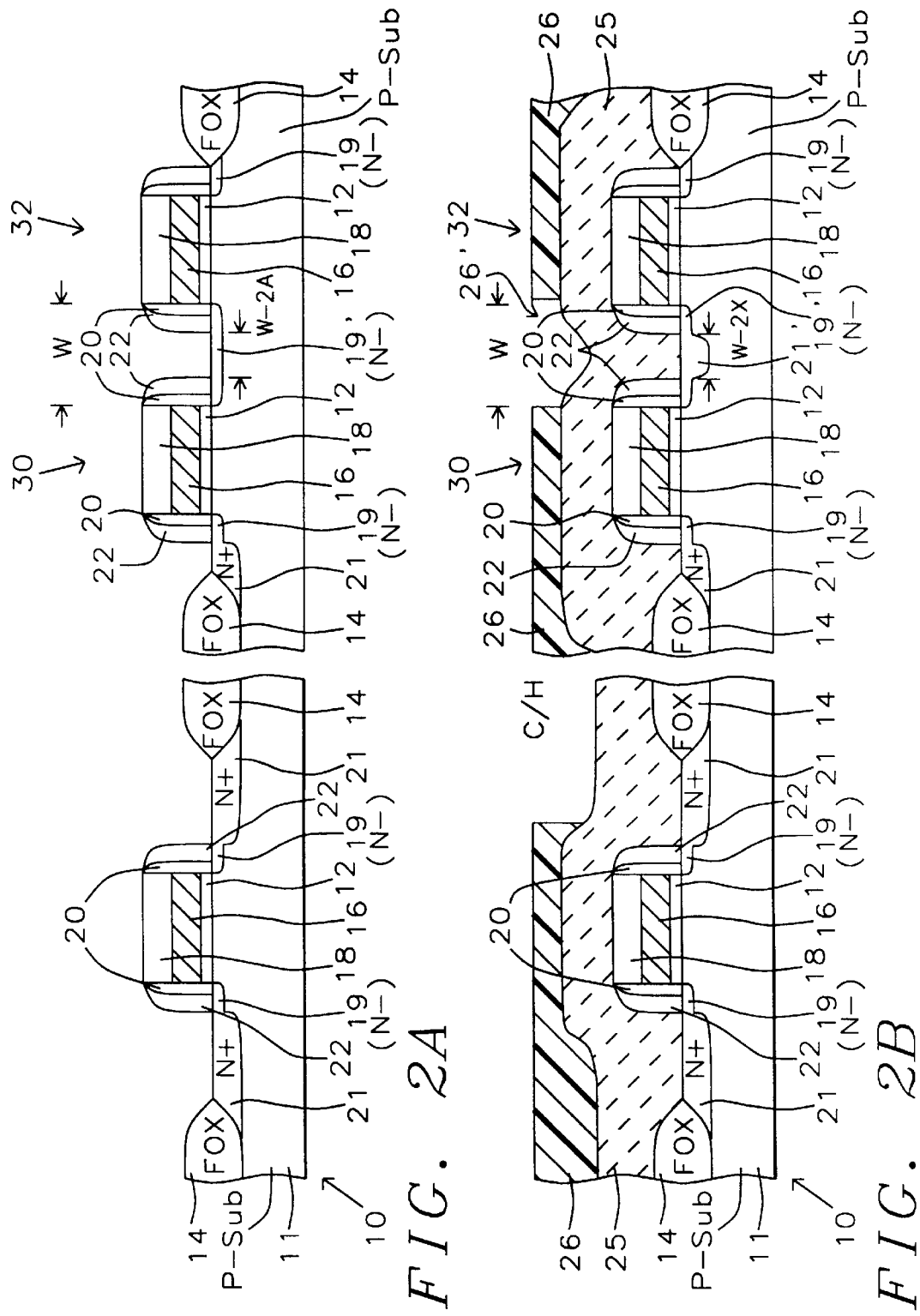

5,905,293

LDD SPACERS IN MOS DEVICES WITH DOUBLE SPACERS

This is a division of patent application Ser. No. 08/851,401, filing date May 5, 1997, now U.S. Pat. No. 5,763,312, Method Of Fabricating Ldd Spacers In Mos Devices With Double Spacers And Device Manufactured Thereby, assigned to the same assignee as the present invention.

BACKGROUND OF THE INVENTION

1. Field of the Invention

This invention relates to methods of manufacture of MOSFET devices and the devices and more particularly to the pattern of spacers employed for manufacture of contacts for LDD devices.

2. Description of Related Art

U.S. Pat. No. 5,208,472 of Su et al. for "Double Spacer Salicide MOS Device and Method" shows a double spacer MOS device and method. The first spacer layer is composed of silicon dioxide and the second spacer layer is formed of an unidentified dielectric layer which is deposited as a blanket layer which is etched back to form spacers which remain in the final product.

U.S. Pat. No. 5,494,838 of Chang et al. for "Process of Making EEPROM Memory Device Having a Sidewall Spacer Floating Gate Electrode" shows another double spacer where the spacers are not removed by the SAC etch as in the present invention. The first spacer layer is composed of silicon nitride and the second spacer layer is formed of silicon oxide.

U.S. Pat. No. 5,468,665 of Lee et al. for "Process for Making a Semiconductor MOS Transistor Employing a Temporary Spacer" shows a method that uses a temporary spacer to inhibit ion implantation during formation of a first high concentration first dopant buried layer in the substrate in the source/drain regions.

Conventional fabrication of LDD spacers in MOSFET devices consists of gate patterning, oxide deposition and oxide etch back to form oxide spacers along gate lines. As the line width decreases and layers of interconnections increase in ICs, the oxide spacers are replaced by silicon nitride spacers for Self-Aligned Contact (SAC) formation for the advantages of wide photolithographic overlay windows and contact isolation. However, the simple $Si_3N_4$ spacers in SAC processes show their limitations between the open area of contacts and LDD spacer length as shown in FIG. 1.

Prior art processing techniques of LDD spacer formation using using double spacers have the disadvantages as follows:

There are narrow processing windows for contact etching and area due to the SAC process where contact area is limited only by LDD spacers.

LDD length is difficult to adjust because of the configuration of the spacers.

SUMMARY OF THE INVENTION

In accordance with this invention, a semiconductor device is formed on a doped silicon semiconductor substrate with a pair of gate conductor stacks formed thereon. The gate conductor stacks comprise a gate oxide layer, a gate electrode layer and a dielectric cap layer, comprising the following.

Lightly doped regions in the surface of the substrate, the lightly doped regions are self-aligned with the gate conductor stacks.

First dielectric spacers of a first dielectric material are formed on the sidewalls of the gate conductor stacks, second dielectric spacers of a second dielectric material on the sidewalls of the first dielectric spacers adjacent to the gate conductor stacks.

Fully doped regions in the surface of the substrate, the fully doped regions being self-aligned with the first and second dielectric spacers formed on the gate conductor stacks.

A blanket dielectric layer covers the device including the spacers and the dielectric cap layer above the gate conductor stacks.

A contact opening is formed through the blanket cap dielectric layer over a contact region excluding second dielectric spacers in the contact opening down to the substrate.

The dielectric cap layer is composed of silicon nitride, the first dielectric spacers are composed of silicon nitride with a thickness from about 300 Å to about 700 Å, and the second dielectric spacers are composed of silicon oxide with a thickness from about 200 Å to about 800 Å.

BRIEF DESCRIPTION OF THE DRAWINGS

The foregoing and other aspects and advantages of this invention are explained and described below with reference to the accompanying drawings, in which:

FIGS. 2A–2C are cross-sectional views of the device of FIGS. 1A–1E shown in the context of other portions of the device.

(1) There are wide processing windows for contact etching and area due to the SAC process where contact area is limited only by a LDD silicon nitride $Si_3N_4$ spacer. (2) The LDD length can adjusted by the combination of silicon oxide and silicon nitride $Si_3N_4$ spacers.

DESCRIPTION OF THE PREFERRED EMBODIMENT

FIGS. 1A–1F show sectional views of a process of manufacturing an LDD MOSFET semiconductor device in accordance with this invention which are formed of a pair of patterned gate conductor stacks 30, 32 on a P- type silicon substrate 11 between FOX regions 14 formed on the surface of the substrate 11.

Figure 1A:
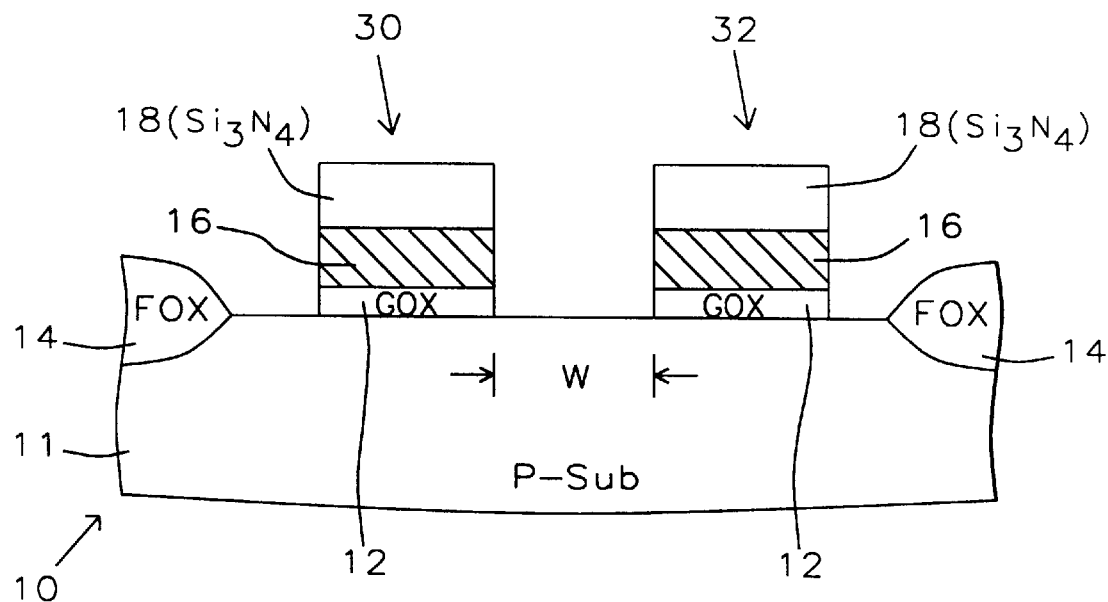
FIGS. 1A–1F show cross-sectional views of a process of manufacturing an LDD MOSFET semiconductor device in accordance with this invention.

Referring to FIG. 1A, each of the stacks 30, 32 is formed on a gate oxide layer 12 (a silicon oxide insulating layer) formed with a thickness from about 100 Å to about 450 Å by subjecting the surface of silicon substrate 11 to a thermal oxidation step.

Each stack 30, 32 includes an an in-situ doped polysilicon conductor layer 16 deposited on the gate oxide layer 12 to a thickness from about 1,000 Å to about 2,000 Å by a conventional Low Pressure Chemical Vapor Deposition (LPCVD) method.

A silicon nitride cap layer 18 is deposited on polysilicon layer 16 to a thickness from about 1,500 Å to about 2,500 Å by a CVD (Chemical Vapor Deposition) method.

Gate conductor stacks 30 and 32 were patterned from blanket layers of the above materials by spreading photoresist on silicon nitride cap layer 18, and forming a photoresist pattern through exposing and developing with a gate conductor forming mask. The portions of silicon nitride cap layer 18, polysilicon conductor layer 16 and gate oxide layer 12 which were not protected by a photoresist pattern were removed by applying a reactive ion etching (RIE) process to define the gate conductor stacks 30 and 32 which are spaced apart by a width W from about 4,000 Å to about 2,500 Å.

Figure 1B:
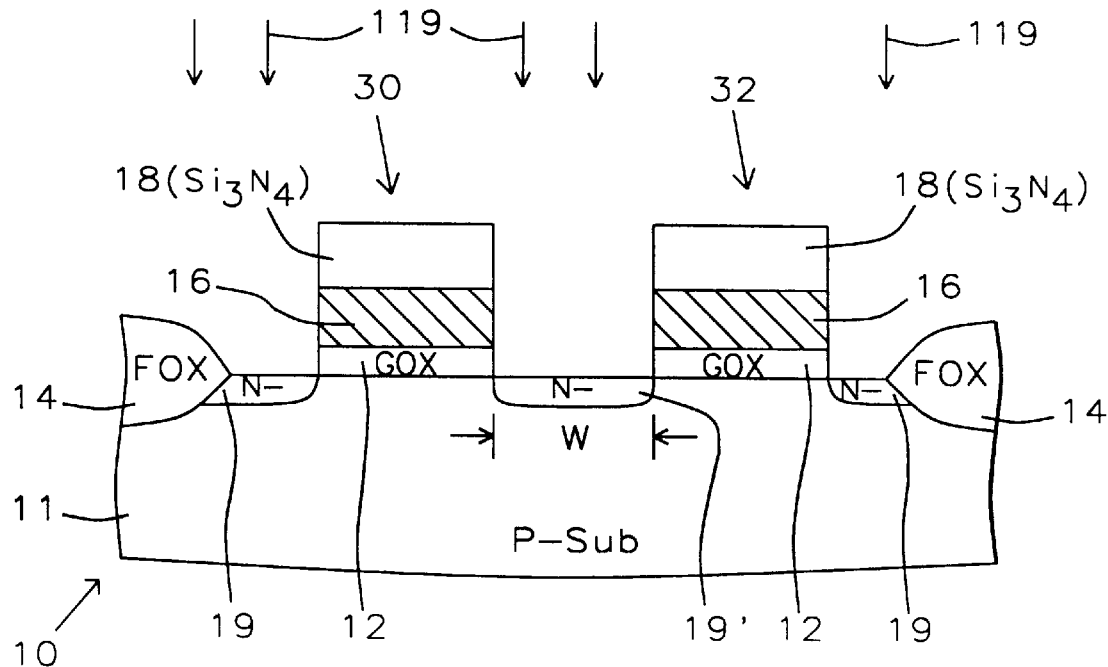

FIG. 1B shows the device of FIG. 1A as a first LDD ion implantation is employed to form LDD lightly doped source/drain region 19/19' in the substrate 11 on either side of the stacks 30/32 aside from the FOX regions 14, using arsenic ions 119 at a dose from about $10^{13}$ ions/cm$^2$ about $10^{14}$ ions/cm$^2$ with an energy from about 20 KeV to about 30 KeV.

The stacks 30/32 serve as ion implantation inhibiting layers. As a result, the ions 119 are implanted into the silicon substrate between and aside from the stacks 30 and 32 thereby forming LDD lightly doped source/drain regions 19/19' on the side of and between the stacks 30/32.

Figure 1C:
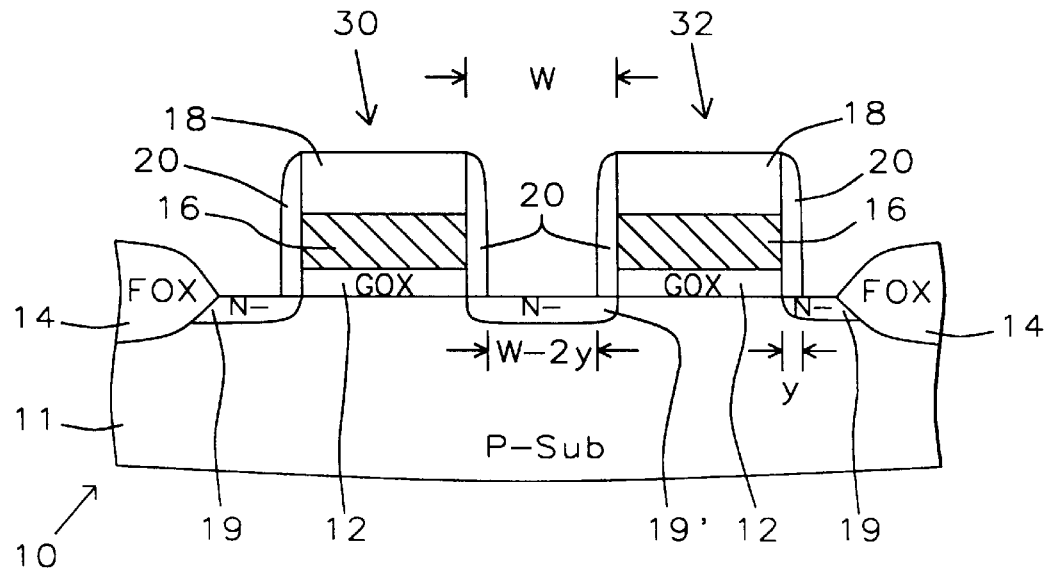

FIG. 1C shows the device of FIG. 1B after a blanket silicon nitride spacer layer has been formed on the device 10 to a thickness "y" from about 400 Å to about 800 Å by a CVD method. Then the silicon nitride spacer layer was etched back by a conventional process to form silicon nitride spacers 20 on the sidewalls of gate conductor stacks 30 and 32. The resultant thickness of silicon nitride spacers 20 is from about 300 Å to about 700 Å.

Figure 1D:
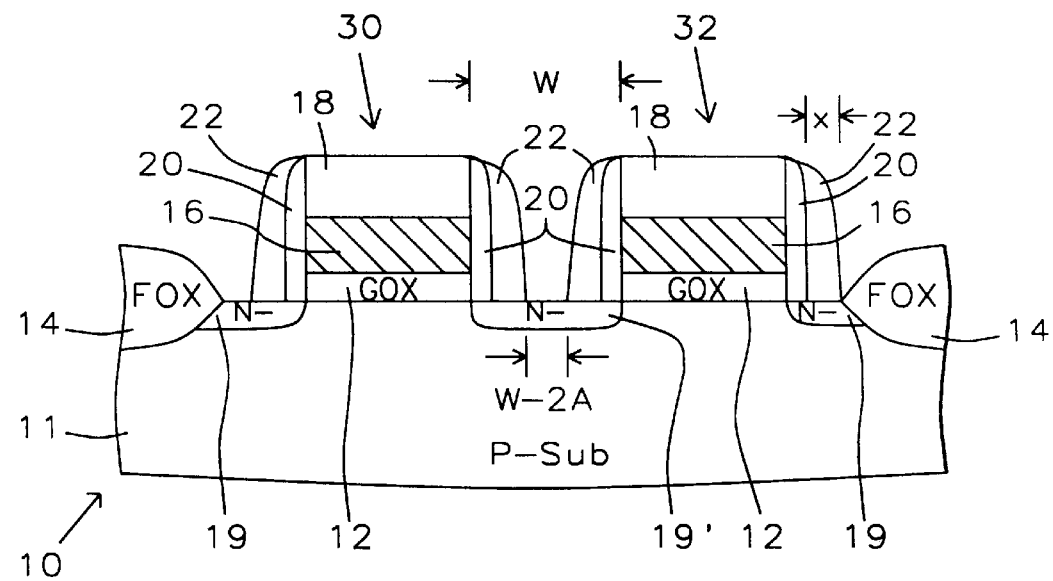

FIG. 1D shows the device of FIG. 1C after a blanket silicon oxide (silicon dioxide, etc.) spacer layer has been formed on the device 10 to a thickness "x" from about 400 Å to about 1,000 Å by a CVD method. Next silicon oxide spacer layer was etched back by a conventional process to form silicon oxide spacers 22 on the sidewalls of silicon nitride spacers 20 which in turn are formed on the sidewalls of gate conductor stacks 30 and 32. The resultant thickness of silicon oxide spacers 22 is from about 200 Å to about 800Å.

The combined thickness A of the silicon nitride spacer layer 20 and silicon dioxide spacer layer 22 is defined by the equation as follows:

$$A = x + y, \text{ where}$$

x=thickness of silicon nitride layer 20
y=thickness of silicon dioxide layer 22

The gap G between the spacers 22 between the stack 30 and stack 32 is defined by the equation as follows:

$$G = W - 2A$$

Figure 1E:
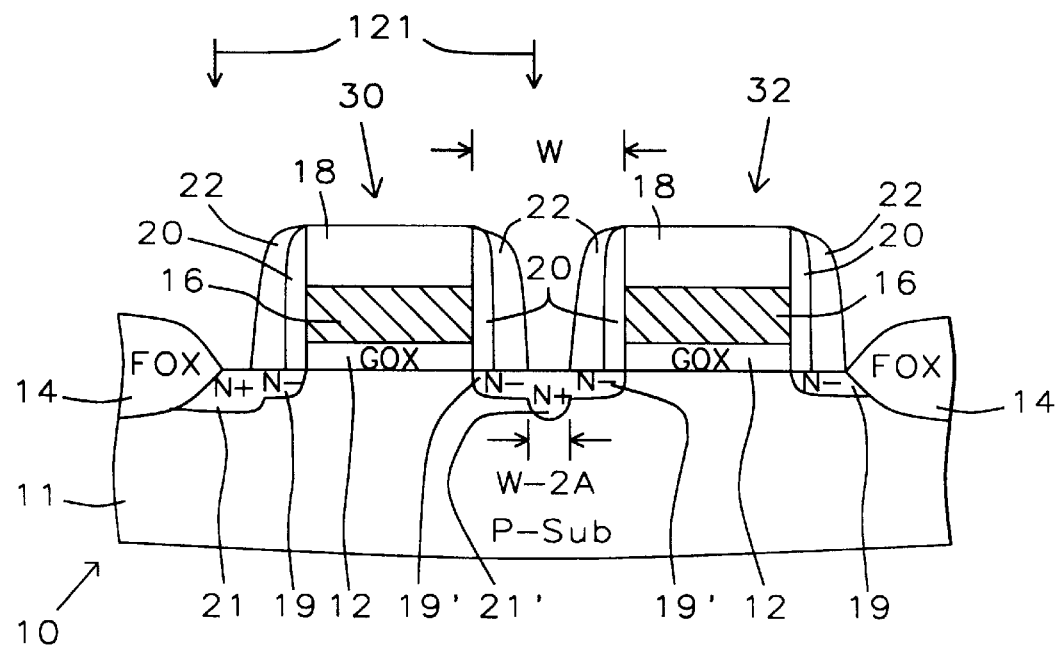

FIG. 1E shows the device of FIG. 1D after ion implantation is employed to form N+ source/drain region 21 on the left of stack 30 and N+ contact region 21' between the stacks 30 and 32. The N+ regions 21/21' are formed using arsenic ions 121 at a dose from about $10^{15}$ ions/cm$^2$ about $10^{16}$ ions/cm$^2$ with an energy from about 30 KeV to about 40 KeV using the silicon oxide spacers 22 combined with silicon nitride spacers 20 to define the sites in which the N+ regions 21/21' are formed. Heat treatment is carried out to form source/drain region 19 and contact region 19' with a dopant concentration from about $10^{19}$ atoms/cm$^3$ about $10^{21}$ atoms/cm$^3$ after heat treatment.

The wider gap G' between the spacers 20 between the stack 30 and stack 32 is defined by the equation as follows:

$$G' = W - 2y$$

Figure 1F:
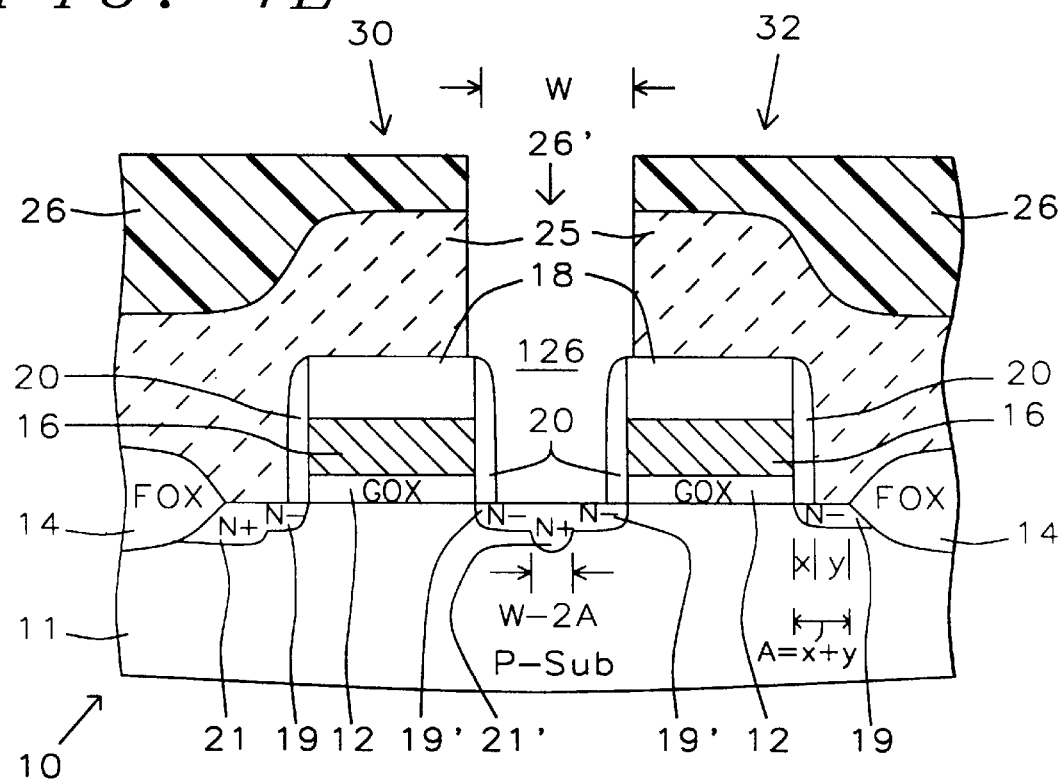

FIG. 1F shows the device of FIG. 1E after a blanket dielectric layer of TEOS silicon dioxide 25 has been formed over the device 10 by decomposing TEOS (TetraEthOxySilane), which is vaporized from a liquid source, by LPCVD process at a temperature from about 650° C. to about 750° C. to a thickness from about 1,000 Å to about 3,000 Å.

Then, a photoresist mask 26 was formed over silicon dioxide layer 25. Mask 26 has an opening 26' over the N-regions 19'/N+ region 21' between the stacks 30/32 where a contact window has been widened by etching away the silicon oxide spacers 22 above the N- regions 19'. The spacers 22 are etched away by RIE with a Self-Aligned Etching (SAE) recipe, using an etchant such as $C_4F_8$/CO/Ar, which has a high oxide etching rate with respect to silicon nitride ($Si_3N_4$) leaving the silicon nitride exposed thereto essentially intact. This leaves a space in contact trench 126 between the stacks 30/32 for contact region 21'/19' therebelow. Thus, silicon nitride spacer layer 20 and cap silicon nitride layer 18 are substantially unaffected by the SAE etch, even where those structures are exposed to the etchant.

Figure 2C:
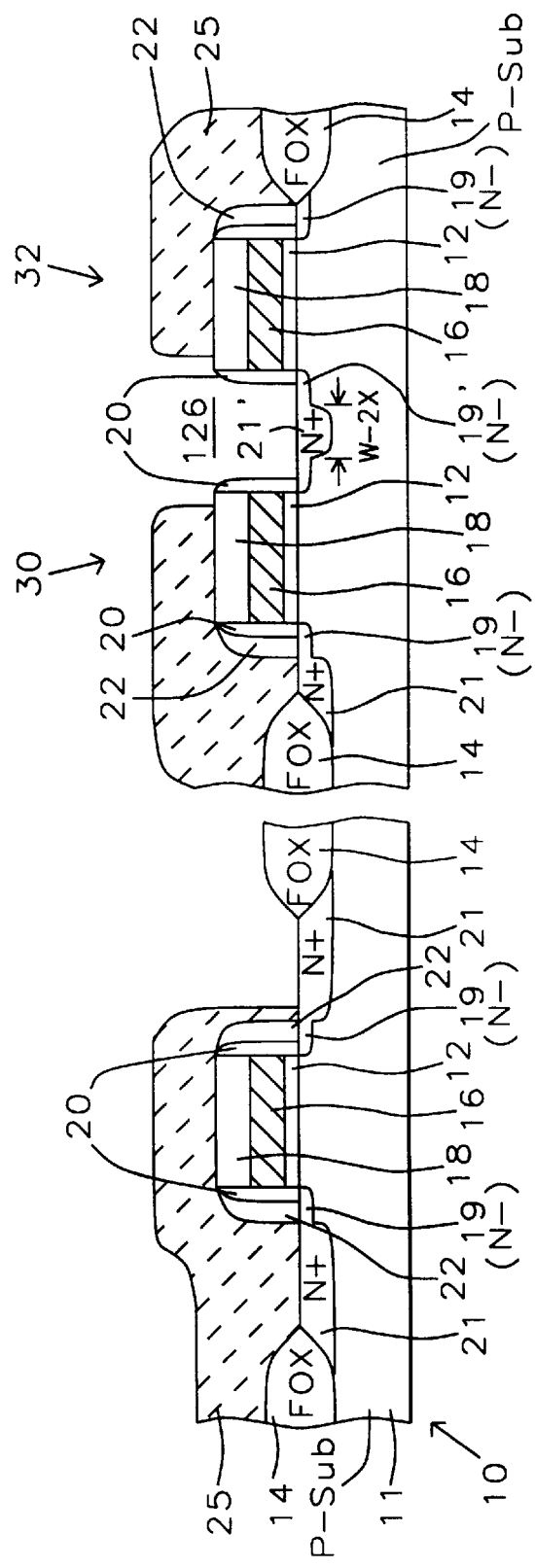

Then the photoresist mask 26 is stripped from the device yielding the structure seen in FIG. 2C.

FIGS. 2A–2C are cross-sectional views of the device 10 of FIGS. 1A–1E shown in the context of a other portions of of the device 10.

FIG. 2A is a cross-sectional drawing of the device 10 of FIG. 1D with the stacks 30/32 of a MOSFET transistor showing the silicon nitride spacers 20 and silicon dioxide spacers 22 and the LDD regions 19/19'.

FIG. 2B shows the MOSFET device 10 of FIG. 2A after the silicon dioxide layer 25 has been formed over device 10 and after photoresist mask 26 has been formed over silicon dioxide layer 25 as in FIG. 1E.

FIG. 2C shows the MOSFET device 10 of FIG. 2B after the silicon dioxide spacers 22 have been removed by etching to form the contact trench 126 above contact region 21'/19', between the gate conductor stacks 30 and 32. The process of etching leaves the silicon nitride spacers 20. In addition, the mask 26 has been stripped from the device 10.

In summary, it will be seen that the LDD structure (regions 19/19') in the an MOSFET transistor are formed before the spacers 20/22 are added to the device 10. Then the first spacers and second spacers are used to define the N+ regions 21/21'. In the contact trench 126, the second spacers 22 are removed to increase the width of trench 126 above contact region 21'/19'.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A semiconductor device on a doped silicon semiconductor substrate with a pair of gate conductor stacks formed thereon, said gate conductor stacks comprising a gate oxide layer, a gate electrode layer and a dielectric cap layer, and a contact opening formed over a contact region, said device comprising:

lightly doped regions in the surface of said substrate, said lightly doped regions being self-aligned with said gate conductor stacks, first dielectric spacers of a first dielectric material are formed on the sidewalls of said gate conductor stacks, second dielectric spacers of a second dielectric material formed on the sidewalls of said first dielectric spacers adjacent to said gate conductor stacks, highly doped regions in the surface of said substrate, said highly doped regions being spaced a distance A away from said gate conductor stacks, where $$A=x+y,$$

x . . . is the thickness of said first dielectric spacer, y . . . is the thickness of said second dielectric spacer, and said highly doped regions being self-aligned with said second dielectric spacers where they are formed on said first dielectric spacers adjacent to said gate conductor stacks, said contact opening formed over a contact region including said first spacers formed in said contact opening, while excluding said second dielectric spacers in said contact opening down to said substrate, whereby said highly doped region in said contact opening is narrower than the spacing between said first dielectric spacers, and is equal to the spacing which would exist between second dielectric spacers if they were present between said first dielectric spacers.

2. A device in accordance with claim 1 wherein said first dielectric spacers have a thickness from about 300 Å to about 700 Å.

3. A device in accordance with claim 2 wherein said second dielectric spacers have a thickness from about 200 Å to about 800 Å.

4. A device in accordance with claim 2 wherein said first dielectric spacers are composed of silicon nitride.

5. A device in accordance with claim 2 wherein said second dielectric spacers are composed of silicon oxide.

6. A device in accordance with claim 1 wherein said second dielectric spacers have a thickness from about 200 Å to about 800 Å.

7. A device in accordance with claim 6 wherein said first dielectric spacers are composed of silicon nitride.

8. A device in accordance with claim 6 wherein said second dielectric spacers are composed of silicon oxide.

9. A device in accordance with claim 1 wherein said first dielectric spacers are composed of silicon nitride.

10. A device in accordance with claim 1 wherein said second dielectric spacers are composed of silicon oxide.

11. A device in accordance with claim 1 wherein said dielectric cap layer is composed of silicon nitride, said first dielectric spacers are composed of silicon nitride with a thickness from about 300 Å to about 700 Å, and said second dielectric spacers are composed of silicon oxide with a thickness from about 200 Å to about 800 Å.

12. A semiconductor device on a doped silicon semiconductor substrate with a pair of gate conductor stacks formed thereon, said gate conductor stacks comprising a gate oxide layer, a gate electrode layer, a dielectric cap layer, and a contact opening, said device comprising:

lightly doped regions in the surface of said substrate, said lightly doped regions being self-aligned with said gate conductor stacks, first dielectric spacers of a first dielectric material are formed on the sidewalls of said gate conductor stacks, second dielectric spacers of a second dielectric material are formed on the sidewalls of said first dielectric spacers adjacent to said gate conductor stacks, highly doped regions in the surface of said substrate, said highly doped regions being spaced a distance A away from said gate conductor stacks, where $$A=x+y,$$

x . . . is the thickness of said first dielectric spacer, y . . . is the thickness of said second dielectric spacer, and said highly doped regions being self-aligned with said second dielectric spacers where they are formed on said first dielectric spacers adjacent to said gate conductor stacks, a blanket cap dielectric layer over said device including said spacers and said dielectric cap layer above said gate conductor stacks, and said contact opening extending through said blanket cap dielectric layer over a contact region excluding second dielectric spacers in said contact opening down to said substrate.

13. A device in accordance with claim 12 wherein said dielectric cap layer is composed of silicon nitride, said first dielectric spacers are composed of silicon nitride with a thickness from about 300 Å to about 700 Å, and said second dielectric spacers are composed of silicon oxide with a thickness from about 200 Å to about 800 Å.

14. A semiconductor device on a doped silicon semiconductor substrate with a pair of gate conductor stacks formed thereon, said gate conductor stacks comprising a gate oxide layer, a gate electrode layer, a dielectric cap layer, and a contact opening with a width W, said device comprising:

lightly doped regions in the surface of said substrate, said lightly doped regions being self-aligned with said gate conductor stacks, first dielectric spacers of a first dielectric material are formed on the sidewalls of said gate conductor stacks, second dielectric spacers of a second dielectric material are formed on the sidewalls of said first dielectric spacers adjacent to said gate conductor stacks except for said second dielectric spacers having been been removed from said contact opening, highly doped regions in the surface of said substrate, said highly doped regions having a width W-2A and being spaced a distance A away from said gate conductor stacks, where $$A=x+y,$$

x . . . is the thickness of said first dielectric spacer, y . . . is the thickness of said second dielectric spacer, and said highly doped regions being self-aligned with said second dielectric spacers where they are formed on said first dielectric spacers adjacent to said gate conductor stacks.

15. A device in accordance with claim 14 wherein:

a blanket cap dielectric layer is formed over said device including said spacers and said dielectric cap layer above said gate conductor stacks, and a contact opening extends through said blanket cap dielectric layer over a contact region excluding second dielectric spacers in said contact opening down to said substrate.

16. A device in accordance with claim 14 wherein
said dielectric cap layer is composed of silicon nitride,
said first dielectric spacers are composed of silicon nitride with a thickness from about 300 Å to about 700 Å, and
said second dielectric spacers are composed of silicon oxide with a thickness from about 200 Å to about 800 Å.

17. A device in accordance with claim 14 wherein:
a blanket cap dielectric layer is formed over said device including said spacers and said dielectric cap layer above said gate conductor stacks,
a contact opening extends through said blanket cap dielectric layer over a contact region excluding second dielectric spacers in said contact opening down to said substrate,
said dielectric cap layer is composed of silicon nitride,
said first dielectric spacers are composed of silicon nitride with a thickness from about 300 Å to about 700 Å, and
said second dielectric spacers are composed of silicon oxide with a thickness from about 200 Å to about 800 Å.

* * * * *